United States Patent [19]

Odaka et al.

[11] 4,369,241
[45] Jan. 18, 1983

[54] METHOD OF FORMING A FLUORESCENT SCREEN OF A BLACK MATRIX TYPE COLOR PICTURE TUBE

[75] Inventors: Yoshiyuki Odaka, Isumi; Kiyoshi Miura, Mobara, both of Japan

[73] Assignee: Hitachi, Ltd., Tokyo, Japan

[21] Appl. No.: 232,707

[22] Filed: Feb. 9, 1981

[30] Foreign Application Priority Data

Mar. 19, 1980 [JP] Japan ................... 55-33861

[51] Int. Cl.³ .......................... H01J 9/20; G03C 5/00
[52] U.S. Cl. ........................ 430/25; 430/28; 430/29; 430/299; 430/304; 430/323
[58] Field of Search ............. 430/25, 323, 299, 28, 430/29, 304

[56] References Cited

U.S. PATENT DOCUMENTS

| | | | |
|---|---|---|---|
| 2,533,530 | 12/1950 | Staehle | 430/274 |
| 2,564,414 | 8/1951 | Whyzmuzis | 430/304 |
| 3,146,368 | 8/1964 | Fiore et al. | 430/25 |
| 3,317,319 | 5/1967 | Mayaud | 430/25 |
| 3,615,460 | 10/1971 | Lange | 430/25 |
| 3,661,580 | 5/1972 | Mayaud | 430/25 |
| 4,234,669 | 11/1980 | Pearlman | 430/29 |
| 4,292,393 | 9/1981 | Wada et al. | 430/25 |

Primary Examiner—Charles L. Bowers, Jr.
Attorney, Agent, or Firm—Charles E. Pfund

[57] ABSTRACT

In forming a fluorescent screen of a black matrix type color picture tube, a light absorptive film is first formed on the inner surface of a face plate of the color picture tube. Formed on the light absorptive film is a light-hardenable photosensitive resin film which in turn is exposed to light through a shadow mask at portions corresponding to phosphor applying portions. The unexposed portion of the light-hardenable photosensitive film is then developed. Finally, the exposed portion of the light-hardenable photosensitive film and portion of the light absorptive film therebeneath are removed to partly perforate the light absorptive film so that in the light absorptive film, openings are formed into which the phosphor is applied.

1 Claim, 5 Drawing Figures

METHOD OF FORMING A FLUORESCENT SCREEN OF A BLACK MATRIX TYPE COLOR PICTURE TUBE

BACKGROUND OF THE INVENTION

The present invention relates to a method of forming a fluorescent screen of a black matrix type color picture tube and, particularly to a method of forming a mosaic or stripe pattern film, i.e. so-called black matrix film, of light absorptive material.

In general, in a black matrix type color picture tube, there are provided trios of red, green and blue phosphor dots or stripes arranged in a predetermined pattern on the inner surface of a glass panel, and the gaps among the phosphors are covered with a film of a light absorptive material such as graphite. Conventionally, the fluorescent screen having the above-mentioned structure was generally formed through photolighorgraphy process.

Namely, as disclosed in U.S. Pat. No. 3,558,310, for example, a thin photosensitive or light-hardenable resin film is first formed on the inner surface of a face plate. Next, the photosensitive resin film is exposed to light through a shadow mask so as to harden the portion of the photosensitive resin film where phosphors are going to be applied. Then, unexposed portion of the photosensitive resin film is removed by developing using a hot water spray or the like, so that only the exposed portion corresponding to the phosphor applying portion of the photosensitive resin film remains. Here, the unexposed portion includes the portion which is not hardened completely due to an insufficient exposure to light. After that, the inner surface of the face plate bared by developing corresponding to the unexposed portion and the entire surface of the left behind hardened film (exposed portion) are applied with a slurry of graphite as a light absorptive material, and a graphite film is formed. Next, the left behind hardened film portion of the photosensitive resin film corresponding to the phosphor applying portion is swollen and rendered fragile using an exfoliating agent, and the hardened film portion of the photosensitive resin film and the graphite film formed on it are removed by a hot water spray and thus, the graphite film is partly perforated so that corresponding portion of the face plate is bared for formation of a black matrix film. After that, phosphor is applied into the opening formed in the black matrix film in a manner well known in the art, and after filming an aluminium reflective film is deposited to complete a black matrix fluorescent screen.

However, the foregoing method of forming a black matrix fluorescent screen is complex and needs many steps including application of photosensitive resin, exposure of light, development, application of light absorptive material, exfoliation process, and development in order to once form a hardened photosensitive resin film and then to remove it. It also requires an exfoliation process using an oxidizing agent such as hydrogen peroxide or alkalihypochlorite for removing the exposed portion of the photosensitive resin film, raising disadvantages in handling dangerous processes. Also, the oxidizing agent rusts other components such as the shadow mask, and they remain in graphite even after the fluorescent screen has been completed. Moreover, the waste exfoliating agent must be treated so as to avoid evironmental pollution.

SUMMARY OF THE INVENTION

Accordingly, it is an object of the present invention to provide a method of forming a fluorescent screen of a black matrix type color picture tube wherein a black matrix film is obtained without the exfoliation process through safe and simple steps of processing, thus overcoming the drawbacks of the conventional method.

According to the invention, in a method of forming a fluorescent screen of a black matrix type color picture tube wherein a plurality of trios of phosphor are arranged, in a predetermined pattern, on the inner surface of a face plate of the color picture tube with a film of a light absorptive material applied on gaps between the patterned trios, the method comprises forming the light absorptive film on the inner surface of the face plate, forming a light-hardenable photosensitive resin film on the light absorptive film, exposing to light the portion of the light-hardenable resin film corresponding to phosphor applying portion through a shadow mask, removing unexposed portion of the light-hardenable photosensitive film by developing, and removing exposed the portion of the light-hardenable photosensitive film and the portion of the light absorptive film therebeneath to partly perforate the light absorptive film so that in the light absorptive film, openings are formed into which the phosphor is applied.

DESCRIPTION OF PREFERRED EMBODIMENT

Figure 1A:
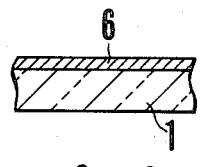
FIGS. 1A to 1E are fragmentary sectional views useful in explaining a method of forming a black matrix film in accordance with the present invention.
Figure 1B:
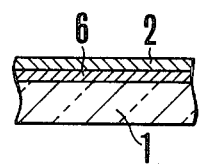
Figure 1C:
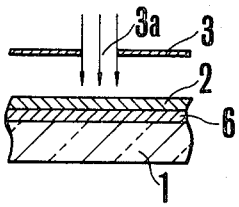
Figure 1D:
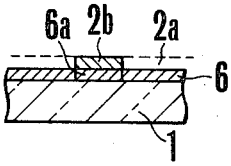

Referring to FIGS. 1A to 1E, there are shown steps of a method for formation of a black matrix film according to the invention. First, as shown in FIG. 1A, a slurry of a light absorptive material such as graphite, manganese dioxide or cobalt oxide is applied on the inner surface of a face plate 1, and then it is dried and baked to form a thin light absorptive film 6. Next, a light-hardenable photosensitive resin solution containing 2% polyvinyl alcohol and 0.2% ammonium dichromate is applied to the light absorptive film 6, then it is dried to form a photosensitive resin film 2 as shown in FIG. 1B. Then, portions of the photosensitive resin film 2 where red, green and blue phosphors are going to be applied are exposed to light using an extra-high voltage mercury vapor lamp at an intensity of about 1200 LX for about 90 seconds through a shadow mask 3 mounted as shown in FIG. 1C.

For simplicity of illustration, only beams of light used for determining the position at which phosphor of one of red, green and blue colors is applied are shown in FIG. 1C. As well known in the art, the position of the phosphor of other colors is determined by light rays emanated from a shifted light house and passing through a shadow mask aperture 3a at an incident angle different from that shown in FIG. 1C.

Figure 1E:
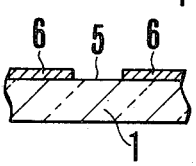

Subsequently, the portion other than that where phosphors are going to be applied, i.e. unexposed portion 2a, is removed by the hot water spray developing at a development pressure of 3.5 kg/cm$^3$, so that the light absorptive film 6 is bared. Development is continued until portion of photosensitive resin film where phosphors are going to be applied, i.e. exposed portion 2b and the light absorptive film 6a therebeneath are removed together, and the remaining film is dried, to ensure that a precise black matrix film having openings 5 into which the phosphors are applied is obtained from the partly perforated light absorptive film 6 as shown in FIG. 1E.

In this way, while in the conventional method, a first layer of the photosensitive resin film is directly applied on the face plate inner surface, the film of light absorptive material is formed as a first layer in the present invention. Therefore, the mechanism of development and removal step in accordance with the invention is totally different from that of the conventional method.

The step of development for removing the photosensitive resin film will be described in detail as follows. Generally, the light absorptive film 6 is a porous film and, therefore, as in the present invention, where photosensitive resin is applied onto it to form the photosensitive resin film 2, photosensitive resin penetrates through the porous film 6 to the depth where it reaches the inner surface of the face plate 1. Therefore, when the photosensitive resin film 2 in this state is exposed to light, not only the exposed portion of the photosensitive resin film 2 on the light absorptive film 6a but also the photosensitive resin which has penetrated into the light absorptive film 6a is hardened. However, light transmitted through the photosensitive resin film is absorbed by the light absorptive film 6a and it hardly reaches an interface of light absorptive film 6a which is in contact with the inner surface of the face plate 1, resulting in an insufficient hardening of the interface. This means that the degree of hardening has a gradient across the light absorptive film. When development is carried out, the unexposed portion 2a is first removed, and then the exposed portion 2b is removed. In this case, the exposed portion 2b and the light absorptive film 6a beneath it firmly couple due to the hardening of photosensitive resin, and consequently, the light absorptive film 6a is removed together with the exposed portion 2b of the photosensitive resin film. This process is based on the fact that adhesion between the light absorptive film 6a and photosensitive resin film 2b is stronger than that between the panel and the light absorptive film 6a, and a junction with the weaker adhesion is separated first by developing, thus the light absorptive film 6a is removed from the panel together with the photosensitive resin film 2b on it. For the unexposed portion 2a, only the photosensitive resin film is removed by developing and the light absorptive film 6 remains on the panel.

In the foregoing embodiment, light absorptive material need not be a black material, but it may be a material such as for example manganese oxalate which is capable of being blackened by baking in the subsequent process.

According to this invention, as described above, a photosensitive resin film is formed on a light absorptive film and the exposed portion of the resin film is removed together with the light absorptive film beneath it by developing to form openings in a black matrix film. Thus, the conventional removing process can be eliminated, and a high quality black matrix film can be obtained through the safe and simple processes.

What is claimed is:

1. In a method of forming a fluorescent screen of a black matrix type color picture tube wherein a plurality of trios of phosphor are arranged, in a predetermined pattern, on the inner surface of a face plate of the color picture tube with a film of a light absorptive material applied on gaps between the patterned trios, said method comprising the steps of:

forming a porous light absorptive film on the inner surface of the face plate;

forming a light-hardenable photosensitive resin film on the light absorptive film with some absorption of the resin material into the underlying upper region of the light absorptive film;

exposing to light the portion of the light-hardenable resin film corresponding to a phosphor applying portion through a shadow mask sufficient to harden the exposed portion and said underlying upper region to firmly couple said films at their interface;

removing the unexposed portion of the light-hardenable photosensitive film by developing; and continuing the development to remove the exposed portion of the light-hardenable photosensitive film and portion of the light absorptive film therebeneath to partly perforate the light absorptive film so that in the light absorptive film, openings are formed into which the phosphor is applied.

* * * * *